United States Patent
Tang et al.

(10) Patent No.: US 8,937,838 B2
(45) Date of Patent: Jan. 20, 2015

(54) FINDING OPTIMAL READ THRESHOLDS AND RELATED VOLTAGES FOR SOLID STATE MEMORY

(71) Applicant: SK hynix memory solutions inc., San Jose, CA (US)

(72) Inventors: Xiangyu Tang, San Jose, CA (US); Lingqi Zeng, Turlock, CA (US); Jason Bellorado, San Clara, CA (US); Frederick K. H. Lee, Mountain View, CA (US); Arunkumar Subramanian, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 134 days.

(21) Appl. No.: 13/691,113

(22) Filed: Nov. 30, 2012

(65) Prior Publication Data

US 2013/0176775 A1    Jul. 11, 2013

Related U.S. Application Data

(60) Provisional application No. 61/585,174, filed on Jan. 10, 2012.

(51) Int. Cl.
*G11C 11/34* (2006.01)
*G11C 16/26* (2006.01)

(52) U.S. Cl.
CPC .................................. *G11C 16/26* (2013.01)
USPC ............... 365/185.2; 365/189.15; 365/189.07

(58) Field of Classification Search
USPC ............................. 365/185.2, 189.07, 189.15
See application file for complete search history.

(56) References Cited

U.S. PATENT DOCUMENTS

| | | | |
|---|---|---|---|
| 7,996,167 B2 * | 8/2011 | Kang et al. ....................... 702/65 |
| 8,000,135 B1 | 8/2011 | Perlmutter et al. | |
| 8,045,567 B2 * | 10/2011 | Chava et al. .................. 370/401 |
| 2008/0276156 A1 | 11/2008 | Gunnam et al. | |
| 2008/0301521 A1 | 12/2008 | Gunnam et al. | |
| 2009/0303788 A1 | 12/2009 | Roohparvar et al. | |
| 2010/0091535 A1 | 4/2010 | Sommer et al. | |
| 2011/0007563 A1 | 1/2011 | Yoo et al. | |

* cited by examiner

*Primary Examiner* — Son Dinh
(74) *Attorney, Agent, or Firm* — Van Pelt, Yi & James LLP

(57) ABSTRACT

An expected value associated with stored values in solid state storage, as well as a set of three or more points are obtained where the three or more points include a voltage and a value associated with stored values. Two points having ratios closest to the expected value are selected from the set. A voltage is determined based at least in part on the selected two points and the expected value.

28 Claims, 10 Drawing Sheets

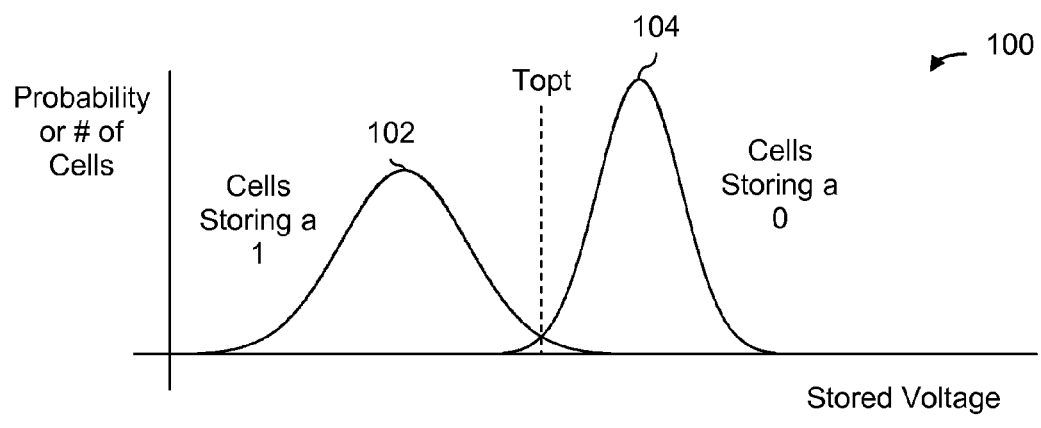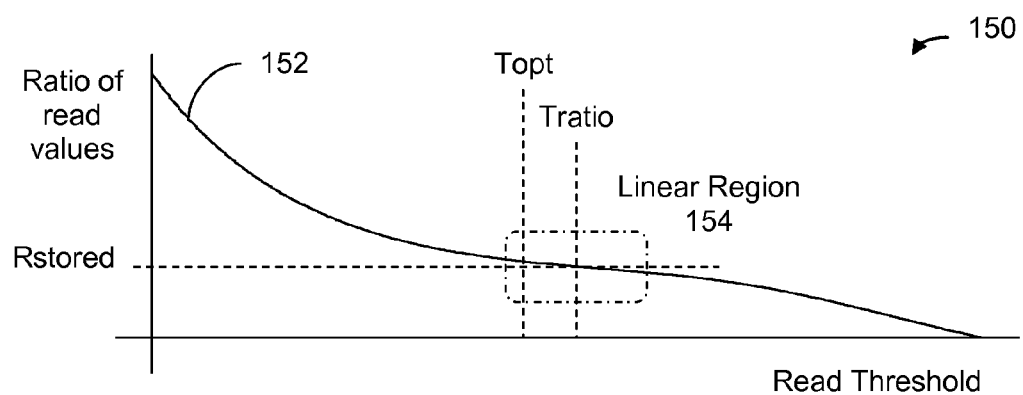
FIG. 1

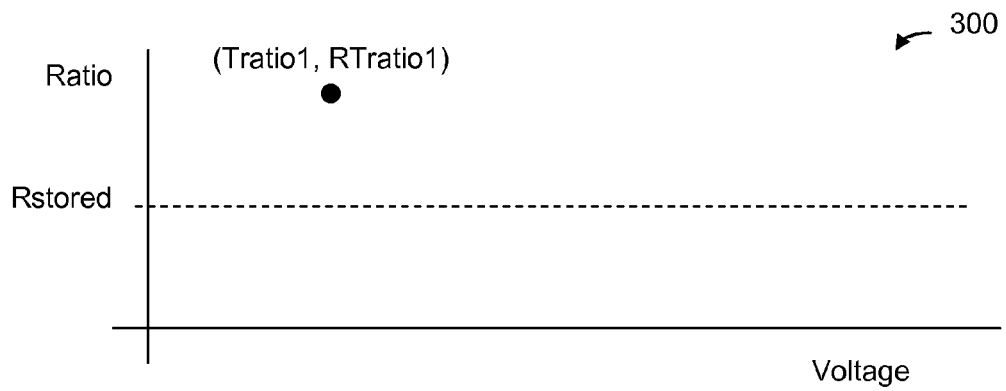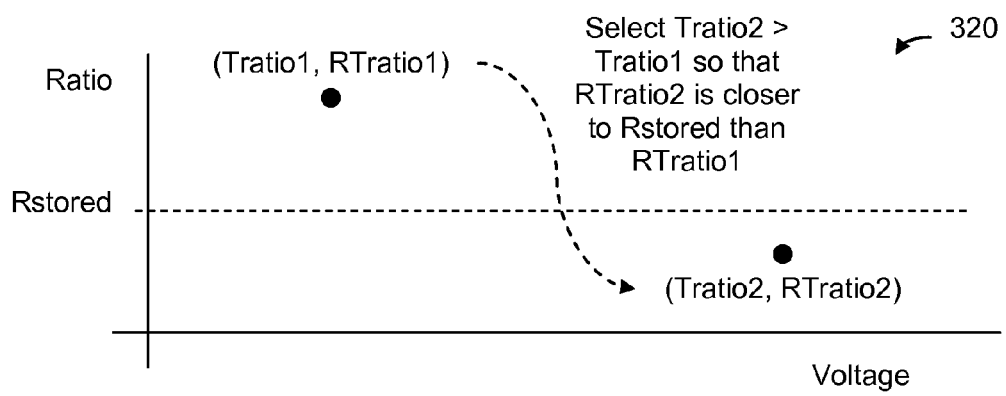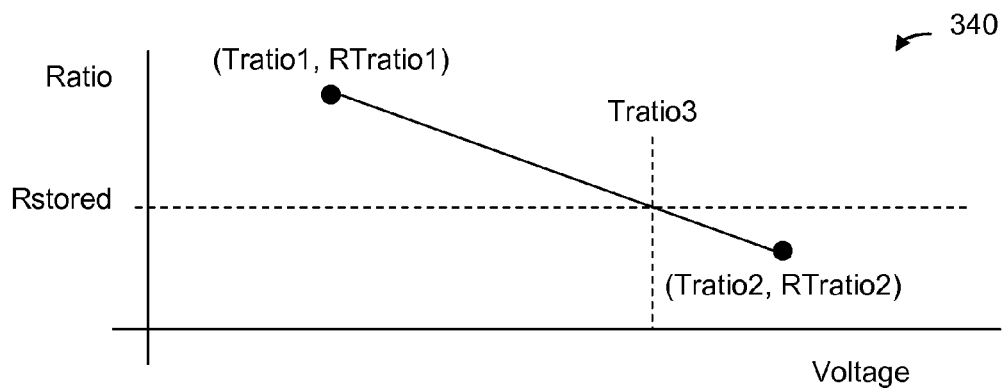
FIG. 3A

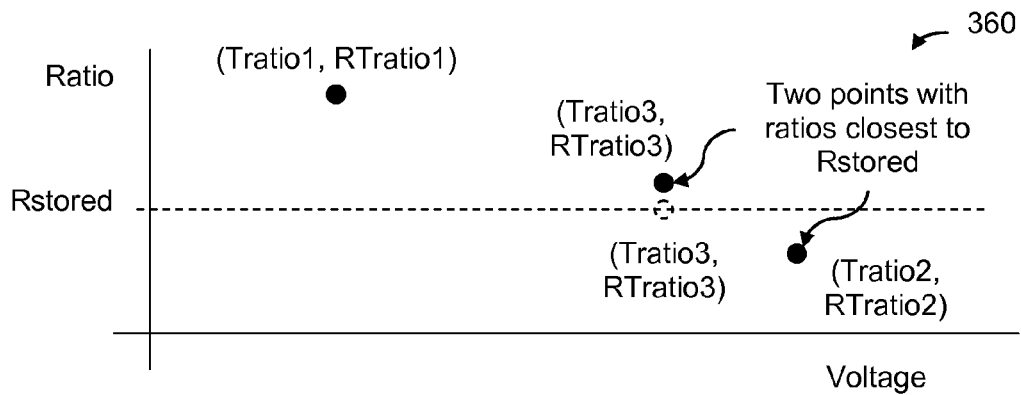
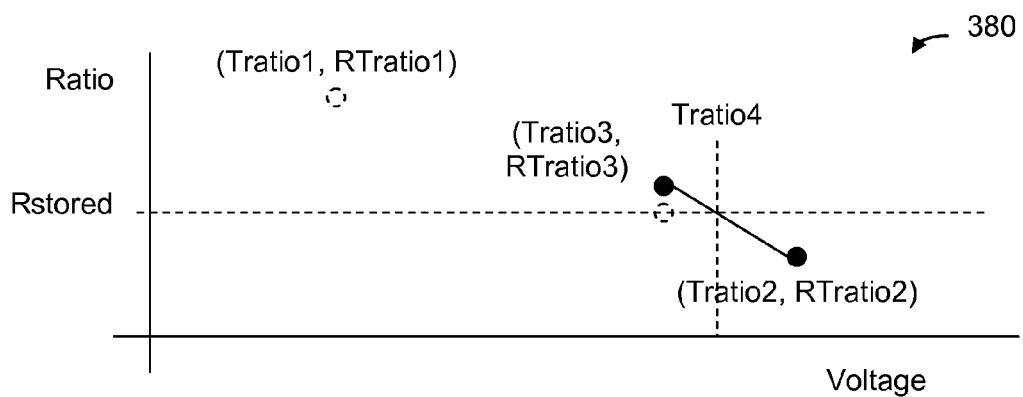
FIG. 3B

700

| Point Name | X (Voltage) | Y (Ratio) |
|---|---|---|
| R1 | Tratio1 | RTratio1 = (ZTratio1)/(OTratio1) |
| R2 | Tratio2 | RTratio2 = (ZTratio2)/(OTratio2) |
| R3 | Tratio3 | RTratio3 = (ZTratio3)/(OTratio3) |
| R4 | Tratio4 | RTratio4 = (ZTratio4)/(OTratio4) |

720

| Input Points | Point Name | X (Voltage) | Y (Slope or Number of Flipped Bits) |
|---|---|---|---|
| R1 and R2 | S1 | X1 = (Tratio1 + Tratio2)/2 | Y1 = (ZTratio2 − ZTratio1)/(Tratio2 − RTratio1) |
| R2 and R3 | S2 | X2 = (Tratio2 + Tratio3)/2 | Y2 = (ZTratio3 − ZTratio2)/(Tratio3 − RTratio2) |
| R3 and R4 | S3 | X3 = (Tratio3 + Tratio4)/2 | Y3 = (ZTratio4 − ZTratio3)/(Tratio4 − RTratio3) |

740

| Input Points | Slope of Lines Formed by S1, S2, and S3 |
|---|---|
| S1 and S2 | (Y1 − Y2)/(X1 − X2)     (Steepest Line) |
| S1 and S3 | (Y3 − Y1)/(X3 − X1) |
| S2 and S3 | (Y3 − Y2)/(X3 − X2) |

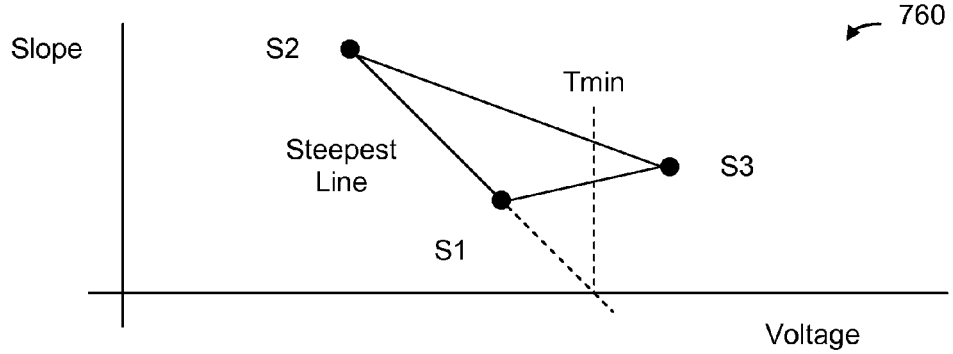

| Topt Iteration # | Topt Generated (Used as Read Threshold) | Other Values Calculated and/or Stored |
|---|---|---|
| 1 | Topt1 = Tratio1 | |
| 2 | Topt2 = Tratio2 = Tratio1 ± Δ | S1 |
| 3 | Topt3 = Tratio3 (based on Tratio1 and Tratio2) | S1 and S2 |
| 4 | If RTratio3 is one of two best ratios then Topt4 = Tratio4 (based on two Tratio values corresponding to best ratios) OR If RTratio3 is not one of two best ratios, then Topt4 = Tratiobest ± Δ | S1-S3 |
| 5 | If RTratio4 is one of two best ratios then Topt5 = (Tratio5+Tmin5)/2 OR If RTratio4 is not one of two best ratios, then Topt5 = Tratiobest ± Δ | S1-S4, Tmin5 |

FIG. 8

FINDING OPTIMAL READ THRESHOLDS AND RELATED VOLTAGES FOR SOLID STATE MEMORY

CROSS REFERENCE TO OTHER APPLICATIONS

This application claims priority to U.S. Provisional Patent Application No. 61/585,174 entitled FINDING OPTIMAL READ THRESHOLDS IN NAND FLASH MEMORY filed Jan. 10, 2012 which is incorporated herein by reference for all purposes.

BACKGROUND OF THE INVENTION

When solid state memory (such as NAND Flash) is read, the returned value depends upon a read threshold. In an example single level cell (SLC) system where a cell stores a single bit, any cell which has a stored voltage lower than the read threshold is interpreted to store a 1 and any cell which has a stored voltage higher than the read threshold is interpreted to store a 0. The value of this read threshold therefore affects performance of the system. In general, it is desirable to develop techniques which improve the process by which a read threshold is determined and/or inputs which are used to determine a read threshold. Improving a read threshold would, for example, reduce the number of read errors and may enable some codewords (e.g., which are uncorrectable using an error correction code when a less optimal read threshold is used during the read process) to be decoded (e.g., because the reduced number of read errors now falls within the error correction capability of the code).

BRIEF DESCRIPTION OF THE DRAWINGS

Various embodiments of the invention are disclosed in the following detailed description and the accompanying drawings.

FIG. 1 is a diagram showing an embodiment of distributions for cells storing zeros and ones and a ratio function associated with read-back values.

FIG. 3A is a diagram showing an embodiment of data points used to generate a first, second, and third Tratio value.

FIG. 3B is a diagram showing an embodiment of data points used to generate a fourth Tratio value.

FIG. 7 is a diagram showing an embodiment of data used to calculate Tmin.

FIG. 8 is a diagram showing an embodiment of optimal read thresholds (Topt) generated at various iterations.

DETAILED DESCRIPTION

Figure 2:
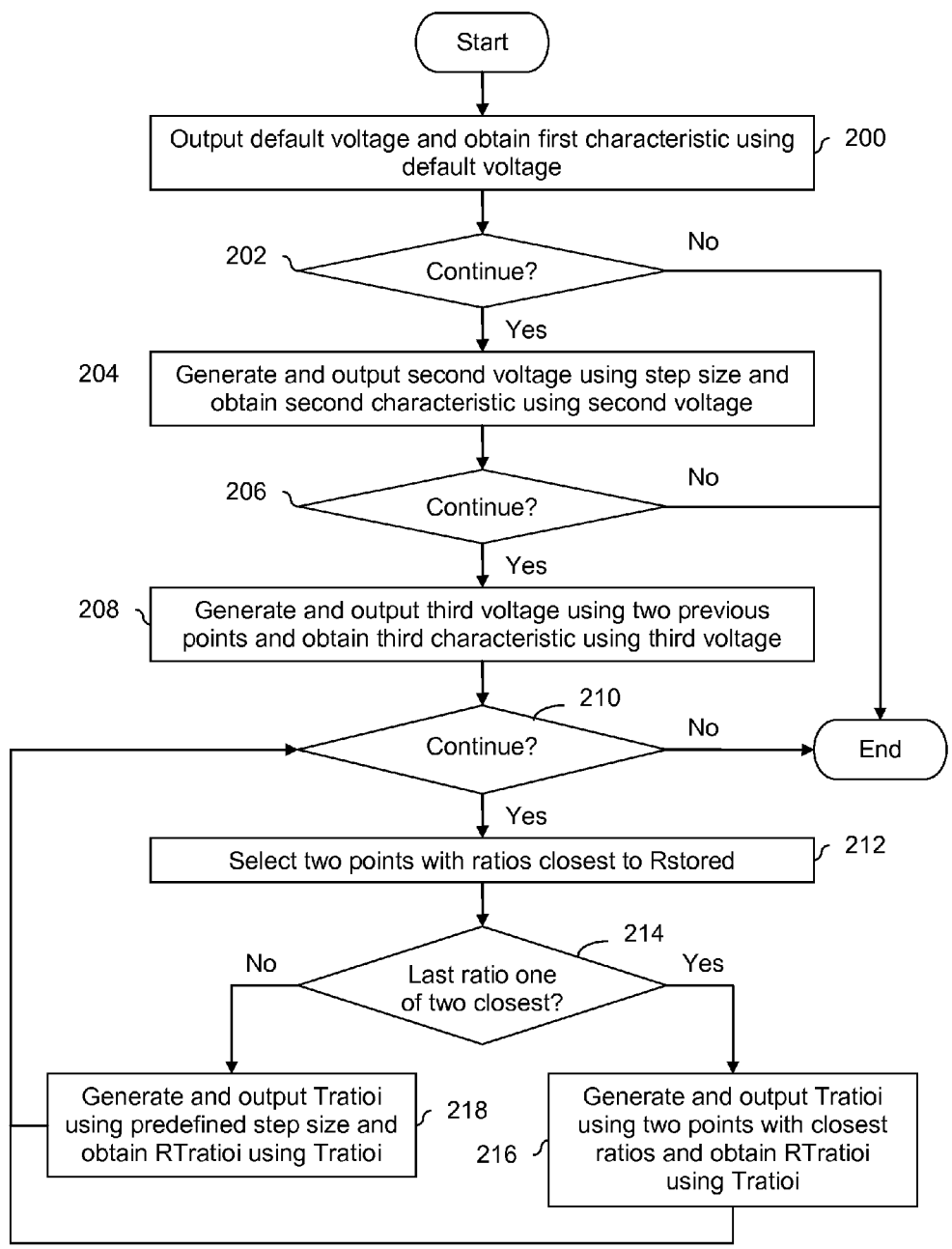
FIG. 2 is a flowchart illustrating an embodiment of a process for iteratively calculating Tratio.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

First, various embodiments for determining Texp and Tmin are described below. Texp is a voltage corresponding to an expected value (e.g., a count or ratio) associated with stored values in solid state storage. In some embodiments, Texp is Tratio, which is the voltage at which a group of cells in solid state storage, when read using Tratio as the read threshold, return values which match some (e.g., known or expected) ratio of stored or read-back values (e.g., ratio of ones to zeros, or ratio of zeros to ones, or the total number of ones, or the total number of zeros). Other embodiments of Texp include voltages corresponding to an expected number of read-back ones or zeros. Although some of the embodiments described herein use ratios or Tratio as an example, a number of expected zeros or ones may be used in some embodiments. Tmin is the voltage at which a local minimum (between a first local maximum and a second local maximum) occurs in a probability distribution function (PDF) or histogram of voltages which are stored by a group of cells.

Also described herein is a technique for estimating an optimal read threshold (Topt) using at least one of Texp and Tmin. (To distinguish between an estimate of the optimal read threshold and the optimal read threshold itself, the former is referred to herein as Topt' and the latter is referred to as Topt.) In some embodiments, one or both of Texp and Tmin are determined using the techniques described herein. Alternatively, some other technique may be used to obtain Texp and/or Tmin.

FIG. 1 is a diagram showing an embodiment of distributions for cells storing zeros and ones and a ratio function associated with read-back values. In diagram 100, the y-axis may be a probability (e.g., distributions 102 and 104 are probability distribution functions (PDFs)) or a number of cells (e.g., distributions 102 and 104 are histograms) showing what probability or number of cells have a particular stored voltage. Distribution 102 shows this for cells which (actually) store a one (e.g., regardless of what value is actually read back or interpreted) and distribution 104 shows this for cells which (actually) store a zero.

The optimal voltage with which to read a group of cells (e.g., a page of cells) having distributions 102 and 104 is Topt. Topt is the x-value at which distributions 102 and 104 intersect each other. However, distributions 102 and 104 are not typically known, so Topt cannot be readily and/or directly obtained using distributions 102 and 104.

Diagram 150 shows a distribution which is more readily available compared to distributions 102 and 104. The y-axis of function 152 is a ratio of read-back values (e.g., a ratio of read-back ones to zeros or a ratio of read-back zeros to ones) and the x-axis is the read threshold used to obtain that particular ratio. In this example, the correct or actual ratio of zeros to ones (or ones to zeros) was stored when the group of cells associated with function 152 was written to; this ratio is Rstored. Oftentimes, because of the random nature of information and/or because of constraints applied to stored data, Rstored≈0.5. In the vicinity around Rstored (i.e., linear region 154), function 152 is relatively linear and can be well approximated with a line. The following figures describe how the linearity of function 152 in linear region 154 can be taken advantage of in order to estimate Tratio.

As an aside, the distribution characteristics of distributions 102 and 104 are asymmetrical (e.g., the variances are not equal) and as a result Topt≠Tratio. If the two distribution characteristics matched then Topt would equal Tratio. Although this example shows Topt<Tratio, in some other embodiments this inequality is reversed.

Although the examples described herein are single level cell (SLC) examples, the technique may be extended to multilevel cell (MLC) systems. For example, if the binary values assigned are 11, 01, 00, and 10 (e.g., from left to right), then the techniques described herein may be used to determine a read threshold for the least significant bit (e.g., to distinguish between X0 and X1). The techniques described herein may also be used to determine a read threshold for the most significant bit (e.g., by dividing the voltage range in half and using distributions which only related to half of the voltage range (such as over 11 and 01 or over 00 and 10, but not both) and/or by using stored ratios which relate to the MSB and not the LSB).

As described above, although this example ratios are described (e.g., Rstored is a stored ratio and Tratio is a voltage corresponding to Rstored), in some embodiments a number of stored ones or zeros may be used and similar techniques are used to find other Texp values which are not Tratio. For example, the distribution of a number of zeros or a number of ones may also be linear around a stored number of ones/zeros, and thus similar techniques to those described herein may be used. In some cases, using ratios is preferred because the Rstored requires fewer bits to store than a number of stored zeros/ones which are stored in a given group of cells. The values of Rstored, for example, may typically remain close to 1 (e.g., because there typically is a relatively even number of ones and zeros) and so no matter how large the group of cells becomes, the number of bits to store Rstored stays relatively the same. In contrast, the number bits required to store a number of ones/zeros grows as the size of the group of cells grows.

FIG. 2 is a flowchart illustrating an embodiment of a process for iteratively calculating Tratio. The example of FIG. 2 will be explained using the examples of FIGS. 3A and 3B. FIG. 3A is a diagram showing an embodiment of data points used to generate a first, second, and third Tratio value. FIG. 3B is a diagram showing an embodiment of data points used to generate a fourth Tratio value.

At 200, a default voltage is output and a first characteristic is obtained using the default voltage. In diagram 300 in FIG. 3A, for example, the first characteristic is a ratio and the point at (Tratio1, RTratio1) shows one example of a default voltage which is output and a first characteristic which is obtained at 200. In one example, if cells store voltages over a range of Vmin and Vmax, then Tratio1=(Vmax−Vmin)/2). In some embodiments, in addition to storing Rstored, a read threshold (e.g., corresponding to Rstored) is stored and that stored read threshold is used at 200.

At 202, it is determined whether to continue. For example, error correction decoding may be performed on data read back using Tratio1 as a read threshold. If error correction decoding is successful, then there may be no need to continue the process further (e.g., since the desired payload data in the error correction encoded data was able to be accessed).

If it is decided to continue at 202, a second voltage is generated and output using a (e.g., predefined or calculated) step size (also referred to as an offset) and a second characteristic is obtained using the second voltage at 204. In diagram 320, for example, Tratio2 is selected to be greater than Tratio1 because this will result in a RTratio2 which is closer to Rstored than RTratio1. This is because (for this example at least) the slope of the ratio function (e.g., ratio function 152 in FIG. 1) is known to be negative and the value of Rstored is known. As such, since RTratio1>Rstored and the slope of the ratio function is negative, a Tratio2 which is greater than Tratio1 is selected. In some other embodiments, the slope of a ratio function is positive and Tratio2 is selected accordingly. In some embodiments, a predefined offset is used in selecting a Tratio2 value (e.g., Tratio2=Tratio1+Δ where Δ is predefined).

At 206, it is determined whether to continue. For example, the read values returned when using Tratio2 as a read threshold may be sufficient for an error correction decoder to successfully perform error correction decoding. If it is decided to continue at 206, a third voltage is generated and output using the two previous points and a third characteristic is obtained using Tratio3 at 208. In the example of diagram 340, Tratio3 is the x-coordinate at which the line y=Rstored intersects the line formed by (Tratio1, RTratio1) and (Tratio2, RTratio2). RTratio3 may be obtained by reading the group of cells using Tratio3 as the read threshold.

At 210, it is determined whether to continue. If so, the two points with ratios closest to Rstored are selected at 212. In diagram 360 in FIG. 3B, for example, the two points with closest ratios are (Tratio3, RTratio3) and (Tratio2, RTratio2) since |RTratio1−Rstored|>|RTratio2−Rstored|>|RTratio3−Rstored|.

As shown in diagram 360, linear approximation may not always match the real ratio function. Tratio3 was obtained using linear approximation. If the linear approximation were perfect (i.e., the ratio function equaled the linear approximation for all points over a range of interest), then reading the group of cells with Tratio3 would yield a ratio of Rstored (i.e., the point is shown with a dashed outline in diagram 360). In actuality, however, the linear approximation is not perfect (i.e., the ratio function does not equal the linear approximation over all points in the range of interest) and reading the group of cells with Tratio3 as the read threshold yields a ratio of RTratio3 where RTratio3>Rstored. For visual clarity, (Tratio3, RTratio3) and (Tratio3, Rstored) are shown with a noticeable gap between the two points but in actually the points may be relatively close; the diagrams shown herein are not necessarily to scale.

It is determined at 214 if the last ratio is one of the two closest. For example, in diagram 360, the last ratio is RTratio3. Since (Tratio3, RTratio3) was one of the points selected at 212, the decision at 214 is in the affirmative If the decision at 214 is Yes then Tratioi is generated and output using the two points with the closest ratios and RTratioi is obtained using Tratioi. For example, in diagram 380, Tratio4 is the x-coordinate of the intersection of y=Rstored and the line formed by (Tratio3, RTratio3) and (Tratio2, RTratio2). Step 216 is similar to step 208.

If the decision at 214 is No then Tratioi is generated and output using a predefined step size (or offset) and RTratioi is obtained using Tratioi. Step 214 is similar to step 204. In some embodiments, a predefined step size is added or subtracted from voltage (i.e., x value) of the point with the ratio (i.e., y value) closest to Rstored. Whether the predefined step size is added or subtracted is selected based on which direction will cause the next or resulting ratio to be closer to Rstored (e.g., similar to step 204).

After steps 218 or 216, it is decided whether to continue at 210.

In some embodiments, there may be no stored ratio (e.g., Rstored) value, no stored number of zeros (e.g., Zstored), or stored number of ones (e.g., Ostored). For example, a system may simply not store this parameter, or the value is stored but it is inaccessible or corrupted. In some such embodiments, a default or predefined ratio is used. For example, a default ratio of 0.5 may be used. The random nature of stored data and/or modulation codes applied to stored data may result in stored data that tends to be equally split between zeros and ones. Ratios of stored values (e.g., which include both stored ratios and default ratios) or numbers of stored ones/zeros, are referred to generally herein as expected ratios. Similarly, numbers or counts of stored zeros/ones (e.g., where an actual value stored at the time a group of cells is written to, or an estimated value in the event no value stored at the time of writing is available) are referred to generally herein as expected numbers or counts (e.g., of zeros/ones).

Figure 4:
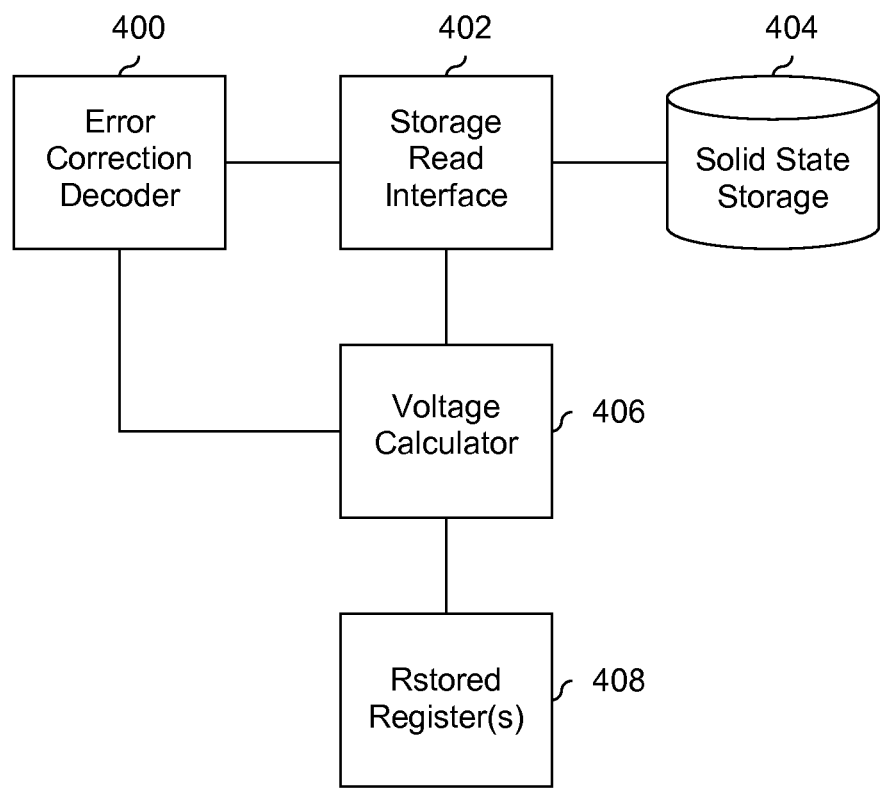
FIG. 4 is a diagram showing an embodiment of a storage system configured to iteratively calculate Tratio.

FIG. 4 is a diagram showing an embodiment of a storage system configured to iteratively calculate Tratio. In some embodiments, voltage calculator 406 performs at least some of the steps shown in FIG. 2. Storage read interface 402 may be used to perform reads (e.g., at steps 200, 204, and 212) in FIG. 2. In some embodiments, some or all of the modules shown are implemented using semiconductor components, such as an application-specific integrated circuit (ASIC) or a field-programmable gate array (FPGA).

In the example shown, data is stored on solid state storage 404 (e.g., NAND Flash). Storage read interface 402 is used to access the data stored on solid state storage 404 and takes as input a read threshold (e.g., Tratioi) and read address(es) and returns the read data. In some embodiments, voltage calculator 406 generates (iteratively, if more than one iteration is desired) Tratio values using Rstored values kept in Rstored register(s) 408 and by obtaining ratios (e.g., RTratio1, RTratio2, etc.) by performing reads via storage read interface 402. In some embodiments where voltage calculator 406 is configured to output Tratio values, those Tratio values are passed from voltage calculator 406 to error correction decoder 400. In one example, error correction decoder 400 is an LDPC decoder. Using the supplied Tratio values, error correction decoder 400 obtains read values from solid state storage 404 via storage read interface 402. In the event error correction decoding of the read values fails, error correction decoder 400 instructs voltage calculator 406 to re-generate another Tratio.

In some embodiments, voltage calculator 406 calculates (e.g., iteratively) Tmin values. In some embodiments, voltage calculator 406 calculates (e.g., iteratively) Topt values, for example based on a Tmin value and/or a Tratio value.

Figure 5:
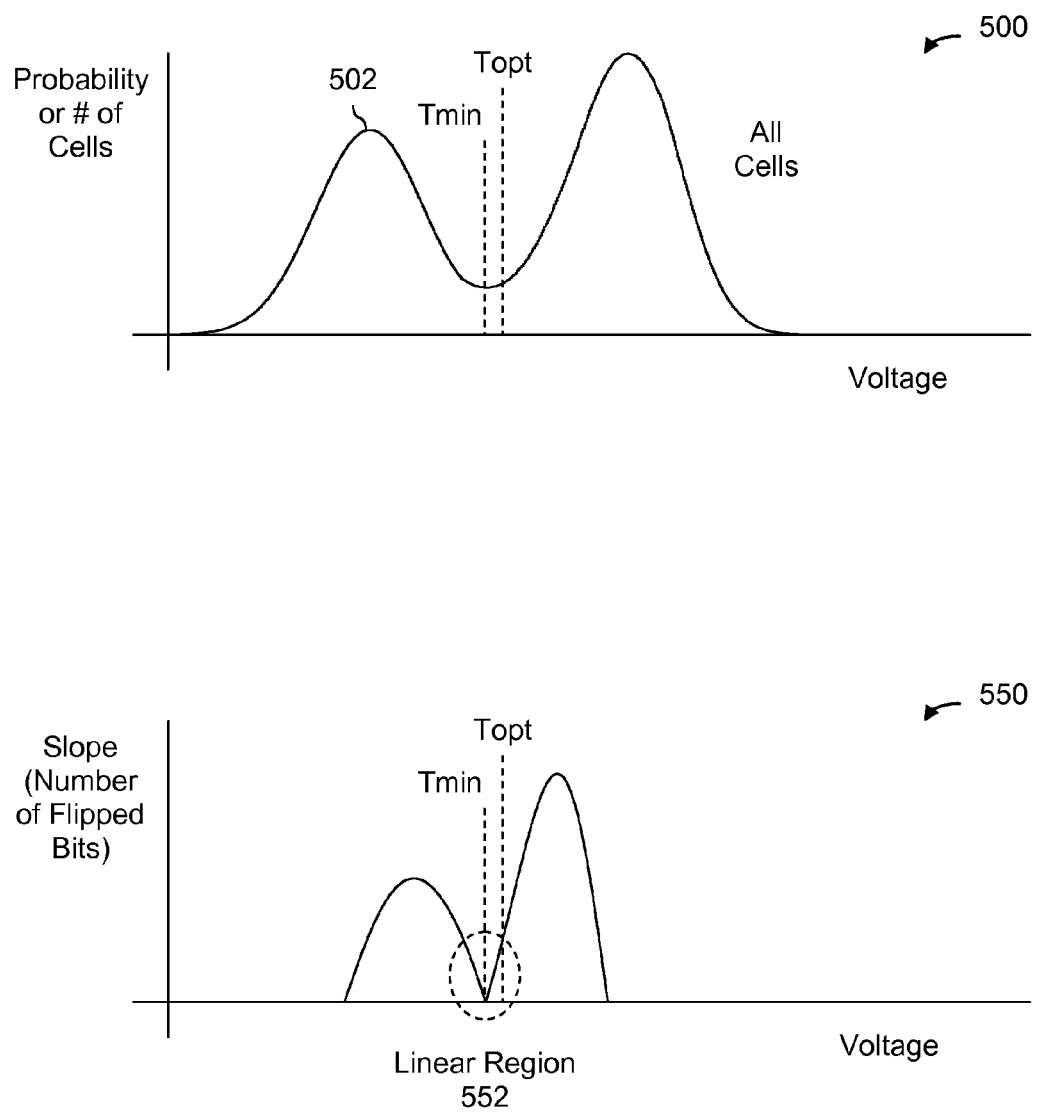
FIG. 5 is a diagram showing an embodiment of a distribution of a group of cells and a slope of that distribution.

FIG. 5 is a diagram showing an embodiment of a distribution of a group of cells and a slope of that distribution. In diagram 500, the y-axis of distribution 502 may be a probability (in which case distribution 502 is a PDF) or a number of cells (in which case distribution 502 is a histogram) having particular stored voltage. Distribution 502 shows this for all cells in a group; distribution 502 does not necessarily know which cells are actually storing a one versus a zero.

The voltage at which distribution 502 has a local minimum is called Tmin. As a result of asymmetrical distribution characteristics in cells actually storing a one versus a zero (e.g., the variances are not equal), Tmin≠Topt. In this particular example Tmin<Topt but in some other embodiments this ordering may be reversed.

Diagram 550 shows the slope of distribution 502 between the two local maxima. At the two local maxima and the local minimum at Tmin in distribution 502, the slope is zero. In the region around Tmin (linear region 552), slope function 550 is substantially or almost linear. Another thing to note about diagram 550 is that it shows, for a given read voltage, how many bits would flip if the read voltage were "wiggled" by an infinitesimally small amount. For example, each point on distribution 502 shows how many cells in a group of cells would be read or interpreted as being "flipped" if the read threshold at a given voltage were changed by a small amount (e.g., V+δ or V−δ). If one point on distribution 502 is (1 V, 3 one-to-zero flips), then three cells in the group are just barely being read or interpreted as ones (e.g., because they are at 0.999 V) and decreasing (as an example) the read voltage by just a little would cause those cells to be read or interpreted as a zero. The following figures described embodiments in which the linear nature of the slope function around Tmin and a number of flipped bits are used to generate Tmin.

Figure 6:
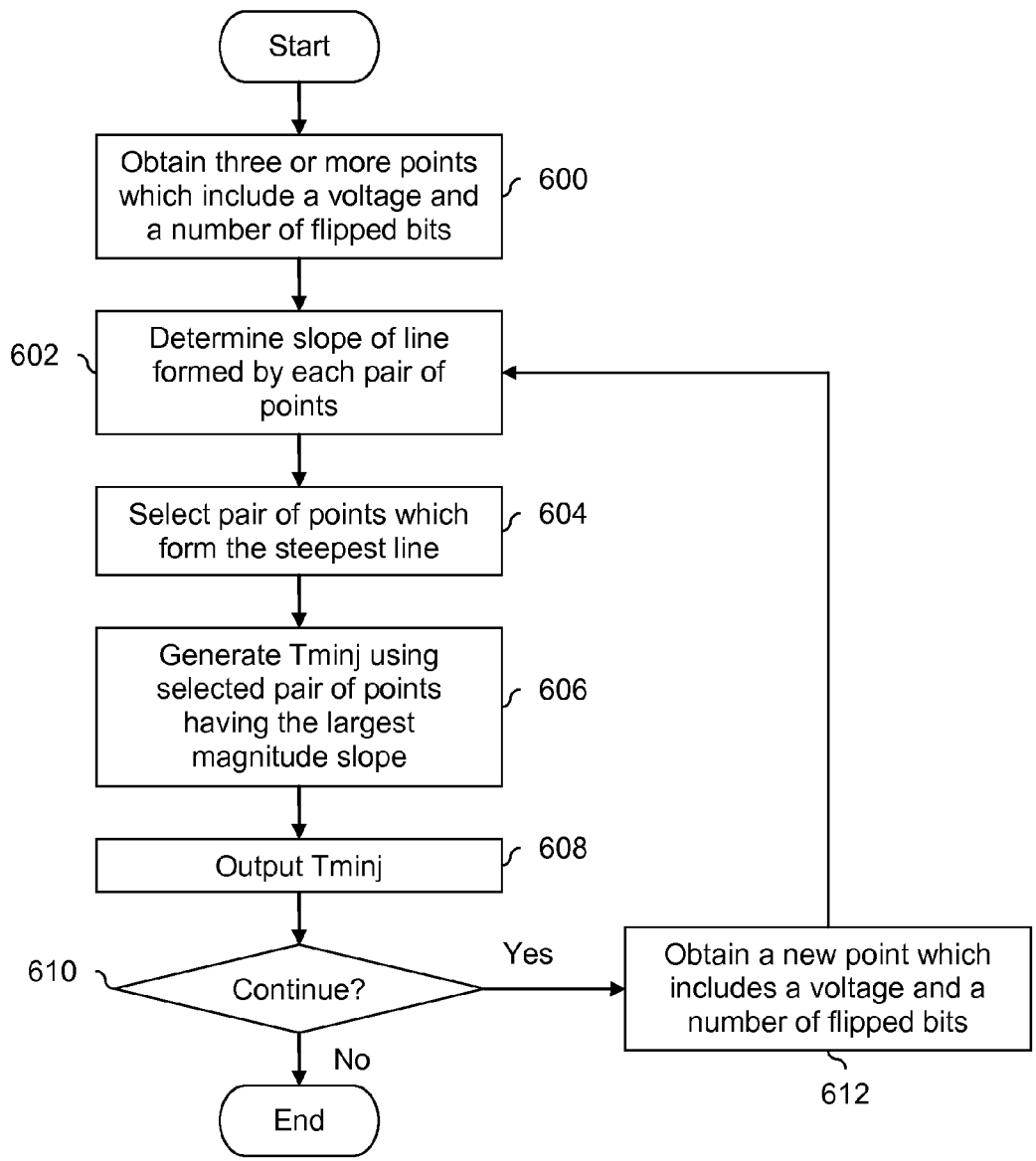
FIG. 6 is a flowchart illustrating an embodiment of an iterative process for calculating Tmin.

FIG. 6 is a flowchart illustrating an embodiment of an iterative process for calculating Tmin. The example of FIG. 6 will be explained using the example of FIG. 7. FIG. 7 is a diagram showing an embodiment of data used to calculate Tmin.

At 600, three or more points are obtained which include a voltage and a number of flipped bits. In some embodiments, the points are obtained at 600 by reading a group of cells at various read thresholds and recording the number of read-back zeros and/or number of read-back ones corresponding to those read thresholds. In some embodiments, data associated with calculating a Tratio value is used in obtaining points at 600. Table 700 in FIG. 7, for example, may shows points and/or data from FIGS. 3A and 3B. The y coordinates of the points in table 700 are ratios of read back values and in this example are ratios of zeros to ones (alternatively, a ratio may be a ratio of ones to zeros) where ZTratio is the number of cells read as having a zero (for a particular read threshold) and OTratio is the number of cells read as having a one (for that same read threshold).

Using the data shown in table 700, the points shown in table 720 are obtained. Points S1, S2 and S3 in table 720 are an example of points obtained at 600 in FIG. 6. The coordinates of point S1 are obtained using data from points R1 and R2, the coordinates of point S2 are obtained using data from points R2 and R3, and the coordinates of point S3 are obtained using data from points R3 and R4. For example, as each iteration of a Tratio generation process is performed, the read back number of zeros or ones (e.g., ZTratio or OTratio) at each iteration is recorded and the two most recent number of read back values is used. Although this example shows the number of flipped bits calculated using a change in a number of zeros, a change in a number of ones may be used. In this example, the x-coordinate in table 720 is the mean or midpoint of x-coordinates of the two input points; in some other embodiments some other x-coordinate value may be used. For example, instead of having X1 be (Tratio+Tratio2)/2, X1 may be the x-coordinate of Tratio1 or the x-coordinate of Tratio2. Referring back to diagram 550 in FIG. 5, points S1, S2 and S3 from table 720 are points on the slope function shown in diagram 550.

The slope of a line formed by each pair of points is determined at 602 and the pair of points which form the steepest line is selected at 604. Table 740 shows the slope of lines formed by S1, S2, and S3 and diagram 760 shows this graphically. In this example, assume that X2<X1<X3 and Y1<Y3<Y2. As such, the line with the steepest slope (i.e., largest magnitude) is the line formed by S1 and S2. The sign of the slope is not taken into consideration when finding the steepest slope at 604 and a line with a steepest slope may be increasing (i.e., sign of slope is positive) or decreasing (i.e., sign of slope is negative).

Tminj is generated using the selected pair of points having the largest magnitude slope at 606 and Tminj is output at 608. As shown in diagram 760, Tmin is the x-coordinate at which the line y=0 intersects the line formed by S1 and S2.

It is determined at 610 whether to continue. For example, an error correction decoder may successfully decode and it is not necessary to generate more Tminj values. If it is decided to continue at 610 then a new point is obtained which includes a voltage and a number of flipped bits at 612 and the slope of a line formed by each pair of points is determined at 602. In some embodiments, a new point is obtained at 612 using data used in generating a Tratio value (see, e.g., diagrams 700 and 702). In some embodiments, previously-calculated slopes generated at 602 are stored so that they do not need to be re-generated the next time step 602 is performed. In such embodiments, only slopes for lines which include a newly-obtained point (e.g., obtained at 612) are calculated at 602.

FIG. 8 is a diagram showing an embodiment of optimal read thresholds (Topt) generated at various iterations. In the example shown, the optimal read thresholds are used as a read threshold to read a group of cells in solid state storage. Although table 800 shows five iterations of an optimal read threshold, in some cases a system may not necessarily be requested to (re)generate that many optimal read threshold values. In some embodiments, the technique used to generate Topt for iterations 6 and greater (if desired) is the same as iteration #5.

At the first iteration in table 800, the optimal read threshold generated is a Tratio value at a first iteration. For example, a default Tratio 1 output may be output as in step 200 in FIG. 2. At the second iteration, the optimal read threshold generated is generating by adding or subtracting an offset or step size (Δ) to the optimal read threshold from the first iteration. See, for example, step 204 in FIG. 2 where an offset is added in a direction that is expected to produce a ratio that is closer to an expected ratio (e.g., Rstored or a default ratio if no ratio is stored). Also at the second iteration, a point S1 (e.g., where one coordinate is a voltage and the other coordinate is a number of bits flipped) is generated and stored. Examples of point S1 are shown in FIG. 7.

At the third iteration, there are two previous Tratio values available (i.e., Tratio 1 and Tratio2) and those values are used to generate the third optimal read threshold. See, for example, step 208 in FIG. 2. The point S2 is also generated and stored during the third iteration. In some embodiments, the process described in FIG. 6 is used to generate S2 (e.g., including by selecting a steepest slope).

At the fourth iteration, the optimal read threshold generated depends on whether the last ratio of read-back values (i.e., RTratio3) obtained using the last optimal read threshold (i.e., Tratio3) is one of the two best ratios. For example if |RTratio1−Rstored|<|RTratio3−Rstored| AND |RTratio2−Rstored|<|RTratio3−Rstored|, then the last ratio is not one of the two best ratios because RTratio1 and RTratio2 are closer to Rstored than RTratio3. If the last ratio is one of the best ratios, then Topt4=Tratio4 which is based on the two Tratio values corresponding to the two best ratios. See, for example step 216 in FIG. 2. If not, an offset or step size is added/subtracted to the voltage corresponding to the best ratio. See, for example, step 218 in FIG. 2.

In the fifth iteration, the process is similar to that in the fourth iteration if the last ratio is not one of the two best ratios. However, if the last ratio is one of the two best ratios, then the optimal read threshold for the fifth iteration is an average of the Tmin and Tratio value. In this particular example, the technique used to generate Tmin5 needs at least S1-S3 and therefore a Tmin value is not available until the fifth iteration because all of S1-S3 are not available during the fourth iteration but only after the fourth iteration concludes. In other embodiments where Tmin is available earlier, Tmin may be used in generating the optimal read threshold in an earlier iteration.

Figure 9:
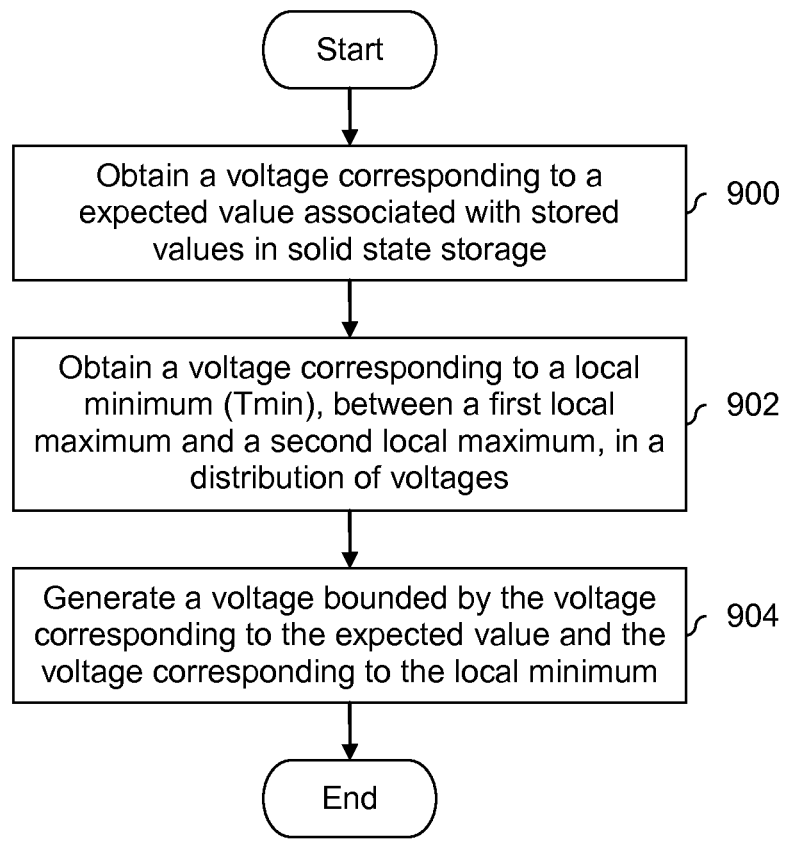
FIG. 9 is a flowchart illustrating an embodiment of a process for generating a read optimal threshold.

FIG. 9 is a flowchart illustrating an embodiment of a process for generating a read optimal threshold. At 900, a voltage corresponding to an expected value associated with stored values in solid state storage is obtained. In some embodiments, the example process shown in FIG. 2 is used to obtain Tratio at 900. Alternatively, some other technique (e.g., not described herein) may be used to obtain the voltage at 900 (e.g., a voltage corresponding to an expected number of zeros/ones). At 902, a voltage corresponding to a local minimum (Tmin), between a first local maximum and a second local maximum, in a distribution of voltages is obtained. In diagram 500 in FIG. 5, for example there are three local minima; the local minimum in the middle is between two local maxima. In some embodiments, step 902 is performed using the example process described in FIG. 6. Alternatively, some other technique (e.g., not described herein) may be used. At 904, a voltage bounded by the voltage corresponding to the expected value and the voltage corresponding to the local minimum is generated. In the example of FIG. 5, Tmin<Topt and in the example of FIG. 1, Tratio>Topt and thus using Tratio and Topt as bounds for Tratio may be a good choice for estimating or generating Topt. In some embodiments, the average of Tmin and Tratio is used as Topt.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
a storage read interface; and
a voltage calculator configured to:
    obtain an expected value associated with stored values in solid state storage;
    obtain a set of three or more points, wherein the three or more points include a voltage and a value associated with stored values;
    select, from the set, two points having ratios closest to the expected value; and
    determine a voltage based at least in part on the selected two points and the expected value.
2. The system of claim 1, wherein the expected value includes one or more of the following: a ratio of ones to zeros, a ratio of zeros to ones, a number of ones, or a number of zeros.

3. The system of claim 1, wherein the voltage calculator is configured to determine the voltage by: determining an intersection between a first line at the expected value and a second line which includes the selected two points.

4. The system of claim 1, wherein:
the voltage calculator is configured to determine the voltage by: determining the voltage at an $i^{th}$ iteration; and
the voltage calculator is further configured to: determine, at a $j^{th}$ iteration, a voltage, including by:
selecting, from the set, a point having a ratio closest to the expected value; and
adjusting the voltage of the selected point, having the ratio closest to the expected value, by an offset.

5. The system of claim 4, wherein the voltage calculator is configured to adjust by: adjusting in a direction that is expected to produce a ratio that is closer to the expected value.

6. The system of claim 4, wherein:
in the event a last point in the set is one of the selected two points, the voltage calculator is configured to determine the voltage at the $i^{th}$ iteration; and
in the event the last point in the set is not one of the selected two points, the voltage calculator is configured to determine the voltage at the $j^{th}$ iteration.

7. A system, comprising:
a storage read interface; and
a voltage calculator configured to:
obtain a set of three or more points, wherein the three or more points include a voltage and a number of flipped bits associated with solid state memory;
determine a slope of a line formed by each pair of points in the set;
select, based at least in part on the determined slopes, a pair of points from the set which have the steepest line; and
determine a voltage based at least in part on the selected pair of points.

8. The system of claim 7, wherein the number of flipped bits includes one or more of the following: a number of bits flipped from one to zero or a number of bits flipped from zero to one.

9. The system of claim 7, wherein the voltage calculator is configured to obtain by:
reading, via the a storage read interface, the solid state memory at a first read threshold to obtain a first number of read-back values;
reading, via the a storage read interface, the solid state memory at a second read threshold to obtain a second number of read-back values; and
determining a first coordinate by taking a difference between the first number of read-back values and the second number of read-back values.

10. The system of claim 9, wherein the voltage calculator is further configured to obtain by:
determining a second coordinate by taking an average of the first read threshold and the second read threshold.

11. The system of claim 9, wherein the first number of read-back values includes one or more of the following: a number of zeros or a number of ones.

12. A system, comprising:
a storage read interface; and
a voltage calculator configured to:
obtain a voltage corresponding to an expected value associated with stored values;
obtain a voltage corresponding to a local minimum, between a first local maximum and a second local maximum, in a distribution of voltages; and
generate a voltage bounded by the voltage corresponding to the expected value and the voltage corresponding to the local minimum.

13. The system of claim 12, wherein the value includes one or more of the following: a ratio of ones to zeros, a ratio of zeros to ones, a number of ones, or a number of zeros.

14. The system of claim 12, wherein the voltage calculator is configured to generate by: determining an average of the voltage corresponding to the expected value and the voltage corresponding to the local minimum.

15. A method, comprising:
obtaining an expected value associated with stored values in solid state storage;
obtaining a set of three or more points, wherein the three or more points include a voltage and a value associated with stored values;
selecting, from the set, two points having ratios closest to the expected value; and
using a voltage calculator to determine a voltage based at least in part on the selected two points and the expected value.

16. The method of claim 15, wherein the expected value includes one or more of the following: a ratio of ones to zeros, a ratio of zeros to ones, a number of ones, or a number of zeros.

17. The method of claim 15, wherein using the voltage calculator to determine the voltage includes determining an intersection between a first line at the expected value and a second line which includes the selected two points.

18. The method of claim 15, wherein:
using the voltage calculator to determine the voltage includes determining the voltage at an $i^{th}$ iteration; and
the method further includes determining, at a $j^{th}$ iteration, a voltage, including by:
selecting, from the set, a point having a ratio closest to the expected value; and
adjusting the voltage of the selected point, having the ratio closest to the expected value, by an offset.

19. The method of claim 18, wherein adjusting includes adjusting in a direction that is expected to produce a ratio that is closer to the expected value.

20. The method of claim 18, wherein:
in the event a last point in the set is one of the selected two points, the voltage at the $i^{th}$ iteration is determined; and
in the event the last point in the set is not one of the selected two points, the voltage at the $j^{th}$ iteration is determined.

21. A method, comprising:
obtaining a set of three or more points, wherein the three or more points include a voltage and a number of flipped bits associated with solid state memory;
determining a slope of a line formed by each pair of points in the set;
selecting, based at least in part on the determined slopes, a pair of points from the set which have the steepest line; and
using a voltage calculator to determine a voltage based at least in part on the selected pair of points.

22. The method of claim 21, wherein the number of flipped bits includes one or more of the following: a number of bits flipped from one to zero or a number of bits flipped from zero to one.

23. The method of claim 21, wherein obtaining includes:
reading, via the a storage read interface, the solid state memory at a first read threshold to obtain a first number of read-back values;

reading, via the a storage read interface, the solid state memory at a second read threshold to obtain a second number of read-back values; and determining a first coordinate by taking a difference between the first number of read-back values and the second number of read-back values.

24. The method of claim 23, wherein obtaining further includes determining a second coordinate by taking an average of the first read threshold and the second read threshold.

25. The method of claim 23, wherein the first number of read-back values includes one or more of the following: a number of zeros or a number of ones.

26. A method, comprising:

obtaining a voltage corresponding to an expected value associated with stored values;

obtaining a voltage corresponding to a local minimum, between a first local maximum and a second local maximum, in a distribution of voltages; and using a voltage calculator to generate a voltage bounded by the voltage corresponding to the expected value and the voltage corresponding to the local minimum.

27. The method of claim 26, wherein the value includes one or more of the following: a ratio of ones to zeros, a ratio of zeros to ones, a number of ones, or a number of zeros.

28. The method of claim 26, wherein using the voltage calculator to generate includes determining an average of the voltage corresponding to the expected value and the voltage corresponding to the local minimum.

* * * * *